(12) United States Patent
Kitamura et al.

(10) Patent No.: US 10,536,779 B2
(45) Date of Patent: Jan. 14, 2020

(54) ELECTROACOUSTIC TRANSDUCER

(71) Applicant: Murata Manufacturing Co., Ltd., Nagaokakyo-shi, Kyoto-fu (JP)

(72) Inventors: Shunsuke Kitamura, Nagaokakyo (JP); Kansho Yamamoto, Nagaokakyo (JP); Takao Mouri, Nagaokakyo (JP); Takuo Hada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/205,264

(22) Filed: Nov. 30, 2018

(65) Prior Publication Data

US 2019/0110131 A1    Apr. 11, 2019

Related U.S. Application Data

(63) Continuation of application No. PCT/JP2017/021746, filed on Jun. 13, 2017.

(30) Foreign Application Priority Data

Jun. 23, 2016   (JP) .................................. 2016-124159

(51) Int. Cl.
*H04R 17/00*          (2006.01)
*H04R 19/00*          (2006.01)
(Continued)

(52) U.S. Cl.
CPC ............ *H04R 17/00* (2013.01); *B06B 1/0688* (2013.01); *B81B 7/0048* (2013.01); *H04R 3/00* (2013.01);
(Continued)

(58) Field of Classification Search
CPC ........ H04R 19/00; H04R 19/005; H04R 1/04; H04R 1/28; H04R 1/222; H04R 17/00;
(Continued)

(56) References Cited

U.S. PATENT DOCUMENTS

2007/0013036 A1* 1/2007 Zhe ...................... B81C 1/0023
                                                                257/659
2009/0001553 A1* 1/2009 Pahl ..................... B81B 7/0064
                                                                257/704
(Continued)

FOREIGN PATENT DOCUMENTS

JP          08-186894 A      7/1996
JP       2004-343658 A    12/2004
(Continued)

OTHER PUBLICATIONS

Official Communication issued in International Patent Application No. PCT/JP2017/021746, dated Aug. 29, 2017.

*Primary Examiner* — Thang V Tran
(74) *Attorney, Agent, or Firm* — Keating & Bennett, LLP (57) ABSTRACT

An electroacoustic transducer includes an ultrasonic element that includes a diaphragm and a support frame, a case body that accommodates the ultrasonic element, and fixing portions that join the support frame portion to a bottom plate portion of the case body. First and second main surfaces of the diaphragm face top and bottom plate portions of the case body, respectively, and a sound hole is provided in the case body. The fixing portions are partially provided along the circumferential direction of the support frame such that a space between the second main surface and the bottom plate portion communicates with a space around the ultrasonic element, and an acoustic path connecting the first main surface and the second main surface and the sound hole is provided in the case body. The fixing portions are defined by a die bonding agent including spherical spacers.

20 Claims, 8 Drawing Sheets

(51) Int. Cl.
*B81B 7/00* (2006.01)
*B06B 1/06* (2006.01)
*H04R 3/00* (2006.01)
*H04R 7/04* (2006.01)

(52) U.S. Cl.
CPC ........ *H04R 7/04* (2013.01); *B81B 2201/0271* (2013.01); *B81B 2207/012* (2013.01); *H04R 2400/11* (2013.01)

(58) Field of Classification Search
CPC .... H04R 17/02; H04R 3/00; H04R 2201/029; H04R 2400/11; H04R 7/04; H04R 31/006; B06B 1/0688; B81B 7/0048; B81B 7/0051; B81B 7/0035; B81B 2201/00; B81B 2201/003; B81B 2201/0271; B81B 2207/01; B81B 2207/012
See application file for complete search history.

(56) References Cited

U.S. PATENT DOCUMENTS

| | | | | |
|---|---|---|---|---|
| 2010/0284553 | A1* | 11/2010 | Conti | B81B 7/0061 381/174 |
| 2011/0089504 | A1* | 4/2011 | Traynor | B81B 3/0094 257/416 |
| 2012/0049300 | A1* | 3/2012 | Yamaguchi | G01L 19/147 257/417 |
| 2012/0280335 | A1* | 11/2012 | Zoellin | H04R 19/04 257/416 |
| 2015/0146888 | A1* | 5/2015 | Kim | H04R 19/005 381/114 |
| 2015/0264463 | A1* | 9/2015 | Kuzuyama | H04R 19/005 381/174 |
| 2016/0007119 | A1* | 1/2016 | Harrington | H04R 7/04 381/174 |
| 2016/0137486 | A1* | 5/2016 | Bharatan | H04R 19/005 257/416 |
| 2016/0155926 | A1 | 6/2016 | Ishii et al. | |
| 2016/0157021 | A1 | 6/2016 | Ishii et al. | |
| 2016/0297671 | A1* | 10/2016 | Pahl | B81B 7/0048 |
| 2017/0150248 | A1* | 5/2017 | Littrell | H04R 1/222 |

FOREIGN PATENT DOCUMENTS

| | | |
|---|---|---|
| JP | 2008-271424 A | 11/2008 |
| JP | 2012-006092 A | 1/2012 |
| JP | 2012-073233 A | 4/2012 |
| JP | 2014-145623 A | 8/2014 |
| JP | 2016-111666 A | 6/2016 |

* cited by examiner

ELECTROACOUSTIC TRANSDUCER

CROSS REFERENCE TO RELATED APPLICATIONS

This application claims the benefit of priority to Japanese Patent Application No. 2016-124159 filed on Jun. 23, 2016 and is a Continuation Application of PCT Application No. PCT/JP2017/021746 filed on Jun. 13, 2017. The entire contents of each application are hereby incorporated herein by reference.

BACKGROUND OF THE INVENTION

1. Field of the Invention

The present invention relates to an electroacoustic transducer which converts an electric signal into sound or converts sound into an electric signal, and in particular, to an electroacoustic transducer which includes an ultrasonic element and a case body.

2. Description of the Related Art

An existing ultrasonic element (also referred to as an ultrasonic transducer) has been known as an element that converts an electric signal into sound or converts sound into an electric signal. The ultrasonic element is manufactured by applying, for example, MEMS (Micro Electro Mechanical System) technology, and the ultrasonic element manufactured by applying the MEMS technology generally includes an extremely thin diaphragm portion. As the ultrasonic element including the diaphragm portion, there are a piezoelectric element and an electrostatic capacitance element.

For example, Japanese Unexamined Patent Application Publication No. 2012-6092 discloses an electroacoustic transducer including a piezoelectric ultrasonic element and a case body accommodating the ultrasonic element. In the electroacoustic transducer disclosed in this publication, the ultrasonic element includes a silicon substrate including a through-hole formed therein and a vibrating film which is formed on one main surface of the silicon substrate so as to close the through-hole and is made of a piezoelectric material, and the other main surface of the silicon substrate is joined to a mounting substrate using an adhesive, and a cover member is assembled on the mounting substrate so as to cover the ultrasonic element mounted on the mounting substrate.

In the electroacoustic transducer disclosed in Japanese Unexamined Patent Application Publication No. 2012-6092, in order to prevent deterioration and variations of the characteristics of the ultrasonic element due to stress from the mounting substrate, a minute protrusion is provided on the other main surface of the silicon substrate and the protrusion and the mounting substrate are joined together with the adhesive.

However, even when the mounting structure of the ultrasonic element disclosed in Japanese Unexamined Patent Application Publication No. 2012-6092 is employed, since, in this structure, the protrusion provided on the silicon substrate is brought into direct contact with the mounting substrate, it is difficult for the stress acting on the ultrasonic element from the mounting substrate to be sufficiently reduced, and there is a risk that significant deterioration and variations of the characteristics of the ultrasonic element may occur.

Since the ultrasonic element includes the extremely thin diaphragm portion as described above, the frequency of vibration that is generated in the diaphragm portion easily varies due to the stress acting thereon from the mounting substrate. Therefore, there is a strong demand to develop a mounting structure of the ultrasonic element, which is less susceptible to the stress from the mounting substrate than the mounting structure disclosed in Japanese Unexamined Patent Application Publication No. 2012-6092.

In addition, when the mounting structure of the ultrasonic element disclosed in Japanese Unexamined Patent Application Publication No. 2012-6092 is employed, it is necessary to form the minute protrusion on the silicon substrate. Due to this, a manufacturing process becomes complicated, which causes a problem that manufacturing cost increases.

On the other hand, when it is assumed that an ultrasonic element manufactured by applying the MEMS technology is used in a frequency band of 40 kHz to 1 MHz which is commonly supposed, a wavelength of ultrasonic waves that are generated in or sensed by the diaphragm portion is about 0.34 mm to about 8.5 mm. Therefore, a typical package size (approximately 1 mm square to approximately 5 mm square) of the electroacoustic transducer including the ultrasonic element and the wavelength of the ultrasonic waves become close to each other, and it is necessary to pay attention, in design, to superposition and cancellation of sounds, for example, in the case body.

Accordingly, it is not easy to improve output and sensitivity in the electroacoustic transducer of this type, and a technique capable of realizing high output and high sensitivity by a simpler method is strongly required.

SUMMARY OF THE INVENTION

Preferred embodiments of the present invention provide electroacoustic transducers that are each capable of reducing or preventing the occurrence of characteristics deterioration and characteristics variations and that are each capable of easily achieving high output and high sensitivity.

An electroacoustic transducer according to a preferred embodiment of the present invention includes an ultrasonic element, a case body and a fixing portion. The ultrasonic element includes a diaphragm which includes a first main surface and a second main surface located at opposing positions and a support frame which defines a hole facing the diaphragm portion and supports the diaphragm portion. The case body includes a top plate portion opposing the first main surface, a bottom plate portion opposing the second main surface, and a peripheral wall portion connecting the top plate portion and the bottom plate portion. The case body accommodates the ultrasonic element, and a sound hole is provided in the case body. The fixing portion fixes the ultrasonic element to the case body by joining the support frame and the bottom plate portion. The fixing portion is partially provided along a circumferential direction of the support frame such that a space between the second main surface and the bottom plate portion communicates with a space around the ultrasonic element. An acoustic path which connects the first main surface and the second main surface and the sound hole and generates resonance in the case body is provided in the case body. The fixing portion is defined by a die bonding agent including a spherical spacer.

In an electroacoustic transducer according to a preferred embodiment of the present invention, it is preferable that the diaphragm portion have a membrane structure including a piezoelectric thin film.

In an electroacoustic transducer according to a preferred embodiment of the present invention, it is preferable that Shore D hardness of the die bonding agent is equal to or lower than about 72.

In an electroacoustic transducer according to a preferred embodiment of the present invention, it is preferable that the sound hole is provided in at least one of the top plate portion and the bottom plate portion.

In an electroacoustic transducer according to a preferred embodiment of the present invention, a projection projecting from a surface of the bottom plate portion toward the support frame on side partially along the circumferential direction of the support frame may be provided on a portion of the surface of the bottom plate portion, which faces the support frame, and in that case, it is preferable that the projection and the support frame are joined together by the fixing portion.

In an electroacoustic transducer according to a preferred embodiment of the present invention, the bottom plate portion may be defined by a substrate, and the top plate portion and the peripheral wall portion may be defined by a cover provided on the substrate.

In an electroacoustic transducer according to a preferred embodiment of the present invention, the ultrasonic element may be disposed on an integrated circuit element which is electrically connected to the ultrasonic element, and the integrated circuit element may be mounted on a substrate, and in this case, the bottom plate portion may be defined by the substrate and the integrated circuit element, and the top plate portion and the peripheral wall portion may be defined by a cover provide on the substrate.

Preferred embodiments of the present invention provide electroacoustic transducers which are each capable of reducing or preventing the occurrence of characteristics deterioration and characteristics variations and which are each capable of easily achieving high output and high sensitivity.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described in detail with reference to the accompanying drawings. In the following preferred embodiments, the present invention is applied to an ultrasonic generator as an electroacoustic transducer, and the ultrasonic generator includes an ultrasonic element manufactured using MEMS technology. In the following preferred embodiments, the same or common portions, elements, and features are denoted by the same reference numerals in the drawings, and description thereof will not be repeated.

First Preferred Embodiment

Figure 1:
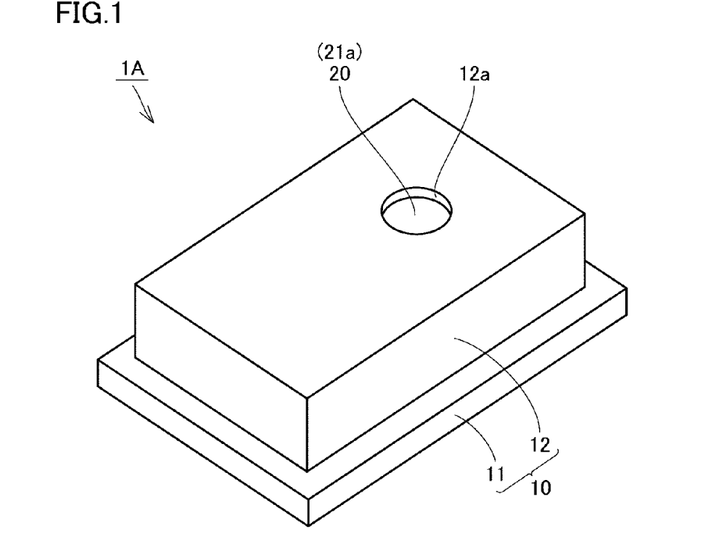
FIG. 1 is a schematic perspective view of an electroacoustic transducer according to a first preferred embodiment of the present invention.
Figure 2:
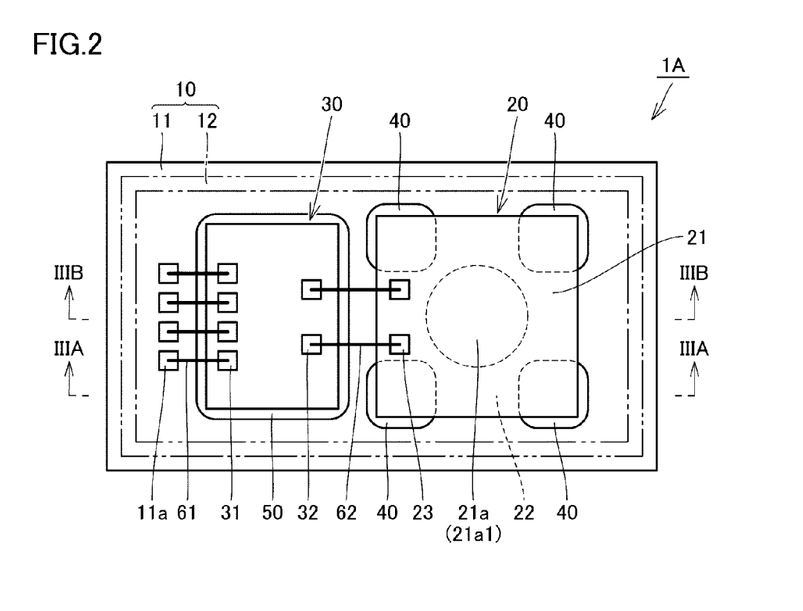
FIG. 2 is a schematic plan view of the electroacoustic transducer illustrated in FIG. 1 in a state in which a cover has been removed.
Figure 3A:
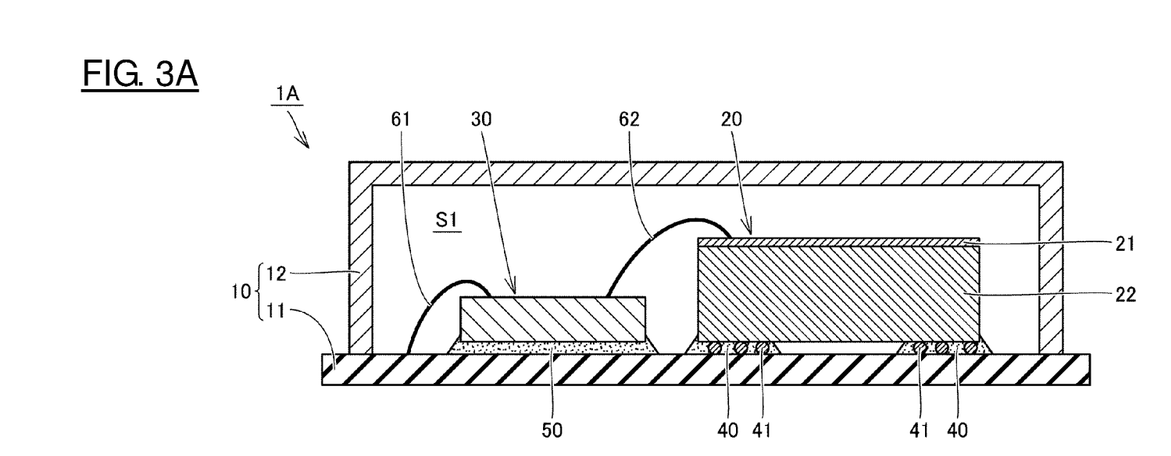
FIGS. 3A and 3B are schematic cross-sectional views of the electroacoustic transducer illustrated in FIG. 1 when taken along a line IIIA-IIIA and a line IIIB-IIIB in FIG. 2.
Figure 3B:
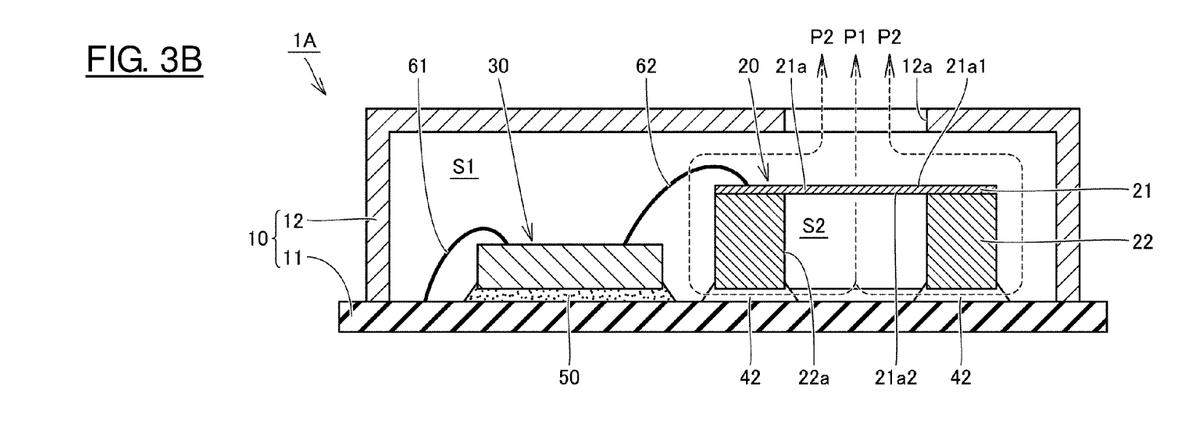

FIG. 1 is a schematic perspective view of an electroacoustic transducer according to a first preferred embodiment of the present invention, and FIG. 2 is a schematic plan view of the electroacoustic transducer in a state in which a cover has been removed. FIGS. 3A and 3B are schematic cross-sectional views along a line IIIA-IIIA and a line IIIB-IIIB in FIG. 2, respectively.

As illustrated in FIGS. 1, 2, 3A, and 3B, an electroacoustic transducer 1A in the present preferred embodiment includes a mounting substrate 11 and a cover 12 defining a case body 10, an ultrasonic element 20 defined by an MEMS device, and an ASIC (Application Specific Integrated Circuit) 30 defining an integrated circuit element provided with a drive circuit to drive the ultrasonic element 20, and other suitable elements.

The mounting substrate 11 is preferably defined by a flat plate-shaped member having a rectangular or substantially rectangular shape in a plan view. The mounting substrate 11 defines a base on which the ultrasonic element 20 and the ASIC 30 are mounted and on which the cover 12 is provided, and is preferably made of, for example, a glass epoxy substrate or other suitable material. Bonding electrodes 11a to which bonding wires 61 to establish electrical connection with the ASIC 30 are joined are provided at predetermined positions on the surface of the mounting substrate 11.

The cover 12 is preferably defined by a box-shaped member including a surface with one opening. The cover 12 covers the ultrasonic element 20 and the ASIC 30 mounted on the mounting substrate 11 and is preferably made of, for example, nickel silver or other suitable material. The cover 12 is attached to the mounting substrate 11 by, for example, a conductive adhesive (not illustrated) or other suitable material.

Here, the cover 12 is provided on the mounting substrate 11 such that the opened surface thereof is closed by the mounting substrate 11. Thus, the case body 10 is defined by the mounting substrate 11 and the cover 12, and the ultrasonic element 20 and the ASIC 30 are accommodated in the case body 10. In other words, the bottom plate portion of the case body 10 is defined by the mounting substrate 11, and the top plate portion and the peripheral wall portion of the case body 10 are defined by the cover 12. It should be noted that the peripheral wall portion connects the top plate portion and the bottom plate portion.

A sound hole 12a having a through-hole shape is provided in a portion of the cover 12, which defines the top plate portion. The sound hole 12a guides ultrasonic waves emitted from the ultrasonic element 20 to the outside of the electroacoustic transducer 1A.

As illustrated in FIGS. 2, 3A and 3B, the ultrasonic element 20 preferably has a rectangular or substantially rectangular shape in a plan view and includes a vibrating film 21 and a support frame 22. The ultrasonic element 20 is mounted at a predetermined position on the surface of the mounting substrate 11 by a die bonding agent defining fixing portions 40, which will be described later. Here, the ultrasonic element 20 is fixed to the mounting substrate 11 such that the vibrating film 21 is positioned at the top plate portion (i.e., the cover 12) side of the case body 10 and the support frame 22 is positioned at the bottom plate portion (i.e., the mounting substrate 11) side of the case body 10.

The vibrating film 21 generates ultrasonic waves and includes a piezoelectric thin film made of, for example, a piezoelectric material. Although there is no particular limitation on the piezoelectric material used to make the piezoelectric thin film, AlN (aluminum nitride) or PZT, for example, may preferably be used. In addition, a pair of electrodes (not illustrated) with the vibrating film 21 interposed therebetween are provided on the vibrating film 21, and a piezoelectric vibrator is thus defined by the vibrating film 21 and the pair of electrodes.

The support frame 22 has a frame shape in plan view and defines a hole 22a having a through-hole shape. The support frame 22 supports the vibrating film 21 and is preferably defined by, for example, a silicon substrate.

The vibrating film 21 is joined to one end of the support frame 22 in the thickness direction in which the hole 22a extends, and one end of the hole portion 22a in the extension direction is closed by the vibrating film 21. Thus, the hole 22a faces the vibrating film 21, and a diaphragm 21a is defined by a portion of the vibrating film 21, which faces the hole 22a.

Since the diaphragm 21a is not directly joined to the support frame 22, it has a membrane structure defined by a piezoelectric thin film. Therefore, when a voltage is applied to the pair of electrodes described above, the diaphragm 21a vibrates along the thickness direction thereof at a predetermined period to generate the ultrasonic waves.

The diaphragm 21a includes a first main surface 21a1 which does not face the hole 22a and a second main surface 21a2 which faces the hole 22a. The first main surface 21a1 thereof faces the top plate portion of the case body 10 (i.e., the cover 12), and the sound hole 12a is disposed at a position opposing the first main surface 21a1 (i.e., a position directly above the diaphragm portion 21a). On the other hand, the second main surface 21a2 faces the bottom plate portion (that is, the mounting substrate 11) of the case body 10 via the hole 22a.

Bonding electrodes 23 to which bonding wires 62 to establish electrical connection with the ASIC 30 are joined are provided at predetermined positions on the surface of the ultrasonic element 20 (an exposed surface of the vibrating film 21).

The ASIC 30 preferably has a rectangular or substantially rectangular shape in a plan view and is mounted at a predetermined position on the surface of the mounting substrate 11 by a die bonding agent as a fixing portion 50. Bonding electrodes 31 to which the bonding wires 61 to establish electrical connection with the mounting substrate 11 are joined are provided at predetermined positions on the surface of the ASIC 30. Bonding electrodes 32 to which the bonding wires 62 to establish electrical connection with the ultrasonic element 20 are joined are provided at another predetermined positions on the surface of the ASIC 30.

Here, as illustrated in FIGS. 2, 3A, and 3B, in the electroacoustic transducer 1A in the present preferred embodiment, fixing portions 40 to fix the ultrasonic element 20 to the mounting substrate 11 by joining the support frame 22 to the mounting substrate 11 are partially provided along the circumferential direction of the support frame portion 22, and gaps 42 (see FIG. 3B) are respectively provided between these partially provided fixing portions 40.

More specifically, in the present preferred embodiment, the fixing portions 40 are provided at four locations corresponding to positions of the four corners of the ultrasonic element 20 having the rectangular or substantially rectangular shape in a plan view, and the ultrasonic element 20 is fixed to the mounting substrate 11 at the four locations. Therefore, the gaps 42 are provided between the support frame 22 and the mounting substrate 11 in central portions of the four sides of the ultrasonic element 20 having the rectangular or substantially rectangular shape in a plan view.

With this configuration, as illustrated in FIG. 3B, in the space in the case body 10, a space S1 located around the ultrasonic element 20 and a space S2 between the second main surface 21a2 of the diaphragm 21a and a portion of the mounting substrate 11, which opposes the second main surface 21a2, the space S2 including the hole portion 22a located in the ultrasonic element 20, communicate via each other with the gaps 42. Therefore, in the case body 10, not only an acoustic path P1 connecting the first main surface 21a1 of the diaphragm 21a and the sound hole 12a provided in the cover 12 is provided but also an acoustic path P2 connecting the second main surface 21a2 of the diaphragm 21a and the sound hole 12a is provided.

Accordingly, both of ultrasonic waves generated at the first main surface 21a1 side and ultrasonic waves generated at the second main surface 21a2 side by vibration of the diaphragm 21a are guided to the outside by passing through the sound hole 12a.

Here, phases of the ultrasonic waves which are generated at the first main surface 21a1 side and the ultrasonic waves which are generated at the second main surface 21a2 side are shifted from each other by about 180°, for example. However, since a distance between the first main surface 21a1 and the sound hole 12a and a distance between the second main surface 21a2 and the sound hole 12a differ from each other, it is possible to generate resonance in the case body 10 by adjusting these distances.

Accordingly, it is possible to easily increase a sound pressure of the ultrasonic waves to be output from the sound hole 12a to the outside by design to satisfy conditions that the ultrasonic waves which are generated at the first main surface 21a1 side and the ultrasonic wave which are generated at the second main surface 21a2 side resonate in the sound hole 12a.

As illustrated in FIG. 3A, in the electroacoustic transducer 1A in the present preferred embodiment, the fixing portions 40 to fix the ultrasonic element 20 to the mounting substrate 11 are defined by the die bonding agent including spherical spacers 41. Here, for example, glass frit or other suitable material may preferably be used as the spherical spacers 41, and an adhesive component of the die bonding agent is preferably silicone resin, low elastic epoxy resin, or other suitable bonding agent, for example.

As described above, mounting of the ultrasonic element 20 on the mounting substrate 11 using the die bonding agent including the spherical spacers 41 enables the ultrasonic element 20 to be mounted in a stable posture and prevents the ultrasonic element 20 and the mounting substrate 11 from being brought into direct contact with each other. Therefore, stress relaxation is achieved in adhesive component portions included in the die bonding agent, thus sufficiently reducing the stress acting on the ultrasonic element 20 from the mounting substrate 11. As a result, it is possible to reduce or prevent changes in the frequency of the vibration which is generated in the diaphragm portion 21a and to reduce or prevent the occurrence of deterioration and variations of the characteristics in the ultrasonic element 20.

Further, it is possible to set the size of the gaps 42 between the ultrasonic element 20 and the mounting substrate 11 to a desired size by mounting the ultrasonic element 20 on the mounting substrate 11 using the die bonding agent including the spherical spacers 41. Therefore, selection of the size of the spherical spacers 41 included in the die bonding agent enables the size of the gaps 42 between the ultrasonic element 20 and the mounting substrate 11 to be easily adjusted to the desired size. As a result, the above-described resonance condition in the case body 10 is able to be easily obtained.

Note that although the size of the spherical spacers 41 may be set as long as the above-described resonance conditions are satisfied, it is preferable that at least the diameter thereof be equal to or larger than about 30 µm, for example, because when the size of the gaps 42 is small, the sonic volume of the ultrasonic waves propagating while passing through the gaps 42 is reduced.

Further, although there is no particular limitation on the content of the spherical spacers 41 in the die bonding agent, it is not preferable that the content thereof be extremely high from the viewpoint of the stress relaxation and it is preferable that the content thereof be equal to or higher than about 5 vol % and equal to or lower than about 10 vol %, for example.

Moreover, a die bonding agent having Shore D hardness of equal to or lower than about 72, for example, is preferably used. This is derived from a result of a second verification test, which will be described below, and usage of such a die bonding agent allows the stress relaxation effect to be sufficiently provided.

In addition, in view of propagation of the ultrasonic waves of a sufficient sonic volume, the cross-sectional area of the gaps 42 is preferably, for example, at least equal to or larger than about 0.036 mm² in total, but is not particularly limited thereto.

Note that the fixing portion 50 to fix the ASIC 30 to the mounting substrate 11 may be a die bonding agent including spherical spacers similar to the fixing portions 40 to fix the ultrasonic element 20 to the mounting substrate 11 or may be a die bonding agent (for example, a die bonding agent including no spherical spacer), which is different from the fixing portions 40 to fix the ultrasonic element 20 to the mounting substrate 11. Alternatively, the ASIC 30 may be mounted on the mounting substrate 11 by a mounting method other than the mounting method using the die bonding agent.

As described above, the electroacoustic transducer 1A in the present preferred embodiment is able to reduce or prevent the occurrence of the characteristics deterioration and the characteristics variations and easily achieve the high output.

The electroacoustic transducer 1A having the above-described configuration may be manufactured using a manufacturing facility, such as a die bonder. More specifically, for example, the electroacoustic transducer 1A may be manufactured by applying the die bonding agent to the mounting substrate 11 in advance using a dispenser or by printing, thereafter mounting, using a collet, the ultrasonic element 20 on the mounting substrate 11 coated with the die bonding agent, and then, solidifying the die bonding agent.

In this case, since the electroacoustic transducer 1A may be manufactured with the simple method in which the die bonding agent including the spherical spacers is used to partially join the ultrasonic element 20, an excellent effect is able to be obtained in that high performance is able to be achieved with almost no increase in manufacturing cost.

FIGS. 4A to 4D are schematic plan views of the vicinity of an ultrasonic element of an electroacoustic transducer according to first to fourth modifications of the first preferred embodiment.

Figure 4A:
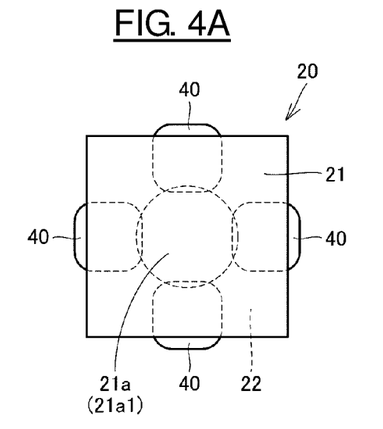
FIGS. 4A to 4D are schematic plan views of the vicinity of an ultrasonic element of an electroacoustic transducer according to first to fourth variations of the first preferred embodiment of the present invention.

In the first modification illustrated in FIG. 4A, the fixing portions 40 are provided at four locations corresponding to positions of central portions of the four sides of the ultrasonic element 20 having the rectangular or substantially rectangular shape in a plan view and the ultrasonic element 20 is fixed to the mounting substrate 11 at the four locations.

Figure 4B:
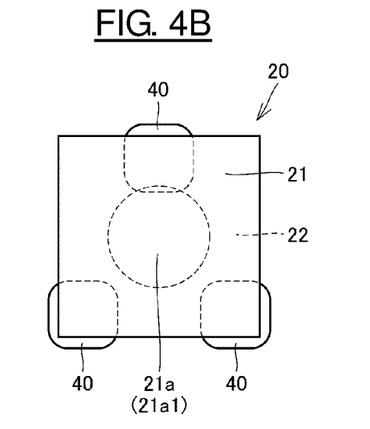

In the second modification illustrated in FIG. 4B, the fixing portions 40 are provided at three locations in total corresponding to locations of two of the four corners of the ultrasonic element 20 having the rectangular or substantially rectangular shape in a plan view and a location of a central portion of one of the four sides of the ultrasonic element 20 having the rectangular or substantially rectangular shape in a plan view, and the ultrasonic element 20 is fixed to the mounting substrate 11 at the three locations.

Figure 4C:
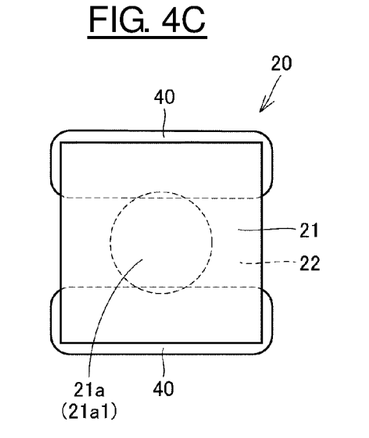

In the third modification illustrated in FIG. 4C, the fixing portions 40 are provided at two locations corresponding to locations of two sides of the four sides of the ultrasonic element 20 having the rectangular or substantially rectangular shape in a plan view, and the ultrasonic element 20 is fixed to the mounting substrate 11 at the two locations.

Figure 4D:
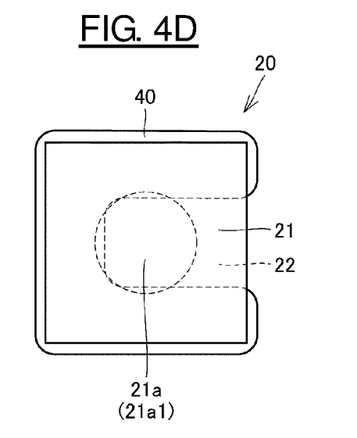

In the fourth modification illustrated in FIG. 4D, the fixing portion 40 is provided at one location corresponding to locations of three sides of the four sides of the ultrasonic element 20 having the rectangular or substantially rectangular shape in a plan view, and the ultrasonic element 20 is fixed to the mounting substrate 11 at the one location.

Even when the layout of the fixing portion(s) 40 in any one of the first to fourth modifications is used, the same or similar advantageous effects as those explained in the first preferred embodiment are able to be obtained. In other words, it is sufficient that the fixing portion(s) 40 provide(s) the space S1 around the ultrasonic element 20 to communicate with the space S2 between the second main surface 21a2 of the diaphragm portion 21a and the portion of the mounting substrate 11, which opposes the second main surface 21a2, and the gap 42 is provided at one or more than one locations in the circumferential direction of the support frame portion 22.

Second Preferred Embodiment

Figure 5:
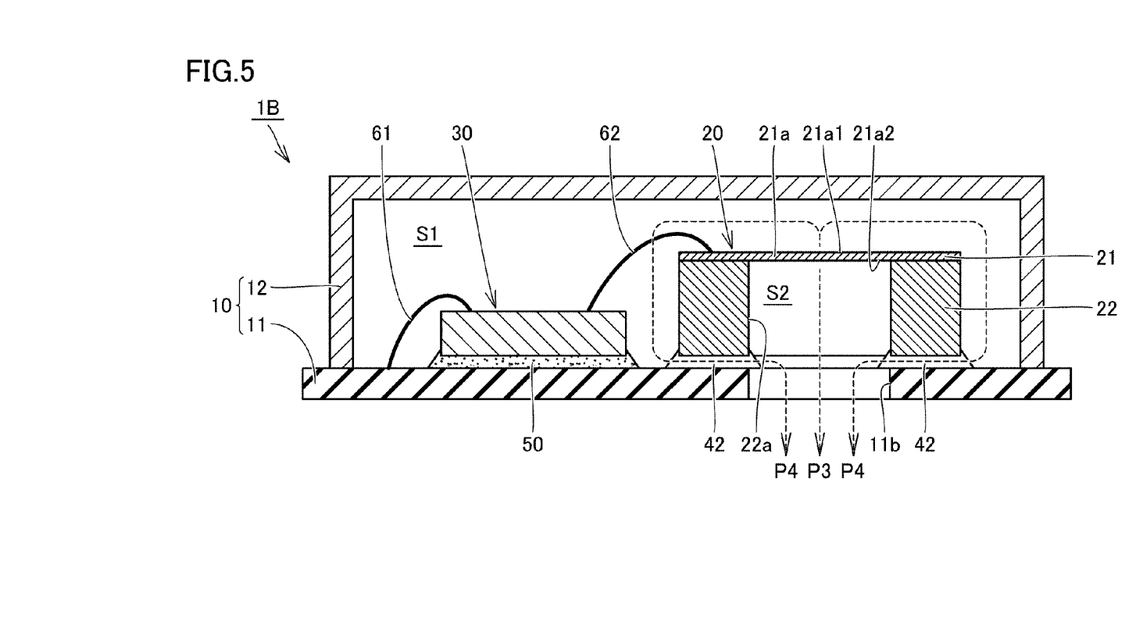
FIG. 5 is a schematic cross-sectional view of an electroacoustic transducer according to a second preferred embodiment of the present invention.

FIG. 5 is a schematic cross-sectional view of an electroacoustic transducer according to a second preferred embodiment of the present invention. An electroacoustic transducer 1B in the present preferred embodiment differs from the electroacoustic transducer 1A in the first preferred embodiment only in a location of a sound hole provided in the case body 10.

Specifically, as illustrated in FIG. 5, in the electroacoustic transducer 1B in the present preferred embodiment, no sound hole is provided in the cover 12 and a sound hole 11b having a through-hole shape is provided in the mounting substrate 11. More specifically, the sound hole 11b is disposed at a location on the mounting substrate 11, which opposes the second main surface 21a2 of the diaphragm portion 21a (i.e., a position directly below the diaphragm portion 21a). With this configuration, ultrasonic waves emitted from the ultrasonic element 20 are guided to the outside of the electroacoustic transducer 1B by passing through the sound hole 11b provided in the mounting substrate 11.

In this case as well, the space S1 around the ultrasonic element 20 and the space S2 between the second main surface 21a2 of the diaphragm portion 21a and the portion of the mounting substrate 11, which opposes the second main surface 21a2, communicate with each other via the gaps 42. Therefore, in the case body 10, not only an acoustic path P3 connecting the second main surface 21a2 of the diaphragm portion 21a and the sound hole 11b provided in the mounting substrate 11 is provided but also an acoustic path P4 connecting the first main surface 21a1 of the diaphragm portion 21a and the sound hole 11b is provided.

Also in the electroacoustic transducer 1B in the present preferred embodiment, advantageous effects the same as or similar to those explained in the first preferred embodiment are obtained. That is, the occurrence of characteristics deterioration and characteristics variations is reduced or prevented and high output is easily achieved.

Third Preferred Embodiment

Figure 6:
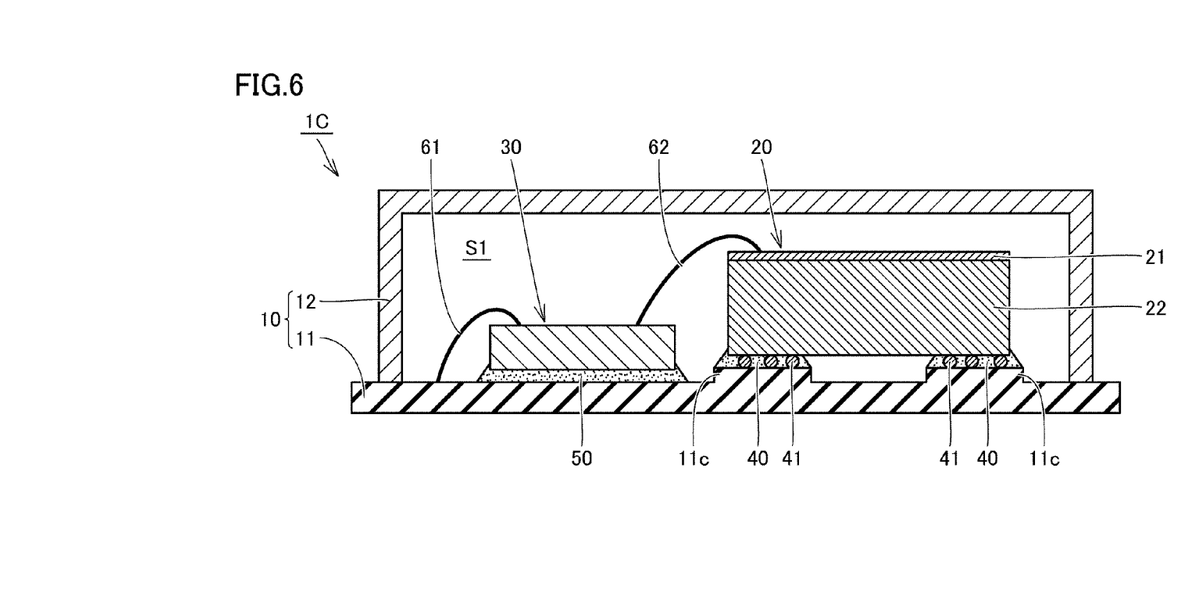
FIG. 6 is a schematic cross-sectional view of an electroacoustic transducer according to a third preferred embodiment of the present invention.

FIG. 6 is a schematic cross-sectional view of an electroacoustic transducer according to a third preferred embodiment of the present invention. An electroacoustic transducer 1C in the present preferred embodiment differs from the electroacoustic transducer 1A in the first preferred embodiment only in the configuration of the mounting substrate 11.

Specifically, as illustrated in FIG. 6, in the electroacoustic transducer 1C in the present preferred embodiment, projections 11c projecting from the surface of the mounting substrate 11 toward the support frame portion 22 side partially along the circumferential direction of the support frame portion 22 are provided on a portion of the surface of the mounting substrate 11, which faces the support frame portion 22 of the ultrasonic element 20. The projections 11c are able to be easily provided, for example, by providing resist resin on the surface of the mounting substrate 11.

The fixing portions 40 to fix the ultrasonic element 20 to the mounting substrate 11 are provided in portions at which the projections 11c are provided and join the projections 11c and the support frame portion 22.

With this configuration, the space S1 around the ultrasonic element 20 and the space S2 between the second main surface 21a2 of the diaphragm portion 21a and the portion of the mounting substrate 11, which opposes the second main surface 21a2, communicate with each other not only via the gaps 42 between the adjacent fixing portions 40 but also via gaps between the adjacent projections 11c.

Also in the electroacoustic transducer 1C in the preferred embodiment described above, advantageous effects of the same as or similar to those explained in the first preferred embodiment are able to be obtained. That is, the occurrence of characteristics deterioration and characteristics variations is reduced or prevented and high output is easily achieved. In addition, with the configuration of the present preferred embodiment further increases the size of the gaps between the ultrasonic element 20 and the mounting substrate 11 and further improves the advantageous effects.

Fourth Preferred Embodiment

Figure 7:
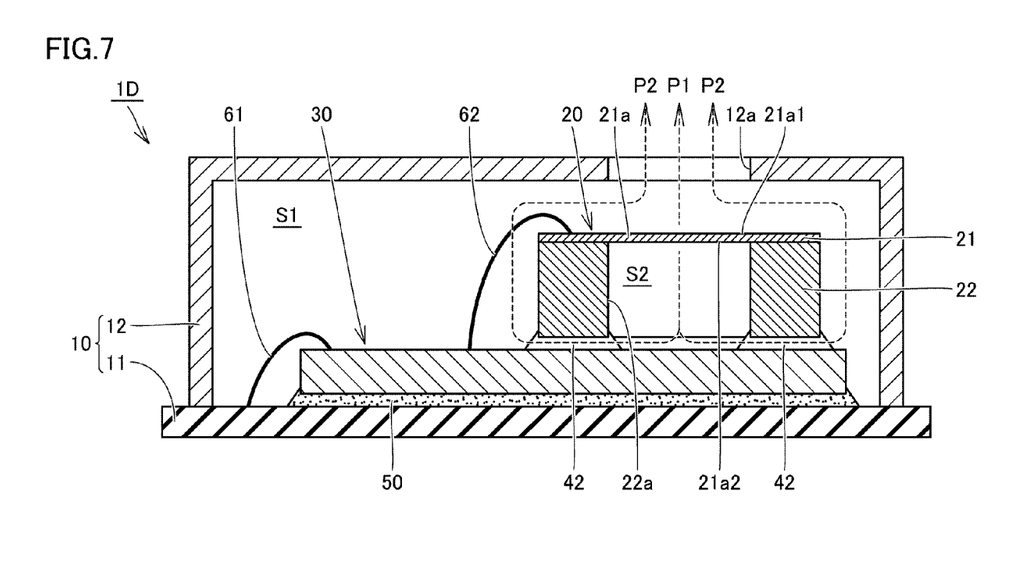
FIG. 7 is a schematic cross-sectional view of an electroacoustic transducer according to a fourth preferred embodiment of the present invention.

FIG. 7 is a schematic cross-sectional view of an electroacoustic transducer according to a fourth preferred embodiment of the present invention. An electroacoustic transducer 1D in the present preferred embodiment differs from the electroacoustic transducer 1A in the first preferred embodiment only in a mounting position of the ultrasonic element 20.

Specifically, as illustrated in FIG. 7, in the electroacoustic transducer 1D in the present preferred embodiment, the ASIC 30 is mounted on the mounting substrate 11 and the ultrasonic element 20 is provided on the ASIC 30 mounted on the mounting substrate 11.

In other words, in this case, the bottom plate portion of the case body 10 is defined by the mounting substrate 11 and the ASIC 30 mounted on the mounting substrate 11, and the top plate portion and the peripheral wall portion of the case body 10 are defined by the cover 12.

Also in the electroacoustic transducer 1D in the present preferred embodiment described above, advantageous effects the same as or similar to those explained in the first preferred embodiment are able to be obtained. That is, the occurrence of characteristics deterioration and characteristics variations is reduced or prevented and high output is easily achieved.

Figure 8:
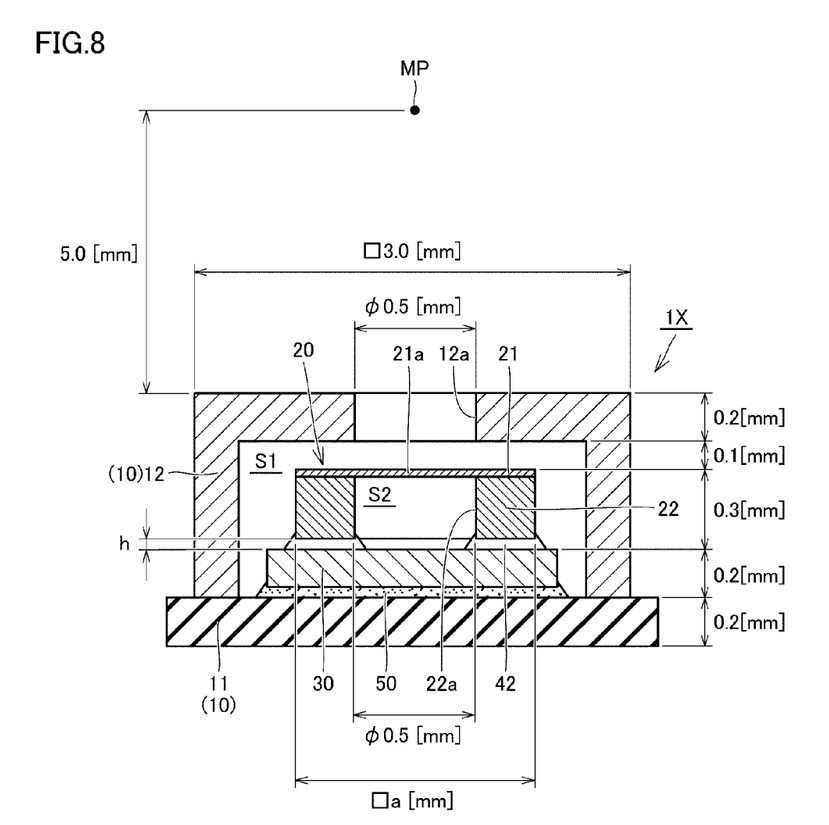
FIG. 8 is a schematic view for explaining models of FEM analysis performed as a first verification test.

In a first verification test, FEM analysis was performed in order to check the degree of advantageous effects that are obtained with preferred embodiments of the present invention. FIG. 8 is a schematic view for explaining models of the FEM analysis performed as the first verification test and FIG. 9 is a graph indicating results of the first verification test.

As illustrated in FIG. 8, the FEM analysis was performed using, as the models, ultrasonic generators 1X of three types configured such that dimensions of respective portions are set as indicated in the drawing and outer dimensions □a of the ultrasonic elements 20 are, for example, a=about 1.0 mm, about 1.3 mm, and about 1.6 mm. In addition, when a position at a distance about 5.0 mm, for example, away from the front side of the sound hole 12a was set to a measurement point MP and a height h of the gaps 42 between the ultrasonic element 20 and the ASIC 30 in each of the three types of models was made to vary in a range of about 0 mm to about 0.2 mm, for example, sound pressures observed at the measurement point MP were calculated.

Here, for example, a driving frequency of the diaphragm portion 21a of the ultrasonic element 20 was set to about 200 kHz, and an amplitude of the diaphragm portion 21a was set to about 1.6 μm. In this case, a wavelength λ of the ultrasonic waves which are generated in the diaphragm portion 21a was about 1.7 mm, for example.

Figure 9:
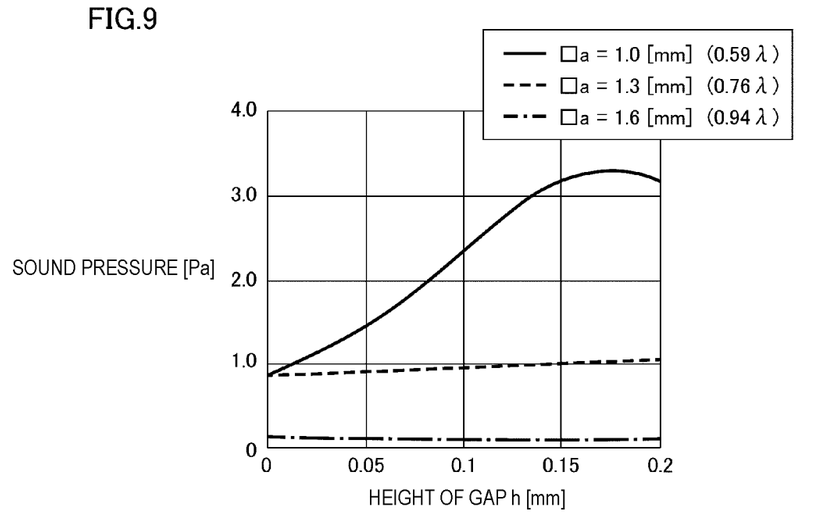
FIG. 9 is a graph indicating a result of the first verification test.

As a result, as illustrated in FIG. 9, it was confirmed that in particular, when the outer dimension of the ultrasonic element 20 was about 1.0 mm, the sound pressure remarkably increased by providing the gaps 42 (i.e., by satisfying h>0). This result was obtained by the ultrasonic waves generated at the first main surface 21a1 side of the diaphragm portion 21a and the ultrasonic waves generated at the second main surface 21a2 side being strengthened by each other as described above.

In the case of the above models, the following was confirmed. That is, when the outer dimension a of one side of the ultrasonic element 20 in a plan view was approximately (0.5+n) times the wavelength λ of the generated ultrasonic waves (i.e., the wavelength of the drive signal) while n was a natural number, the sound pressure increased. Furthermore, when the outer dimension a was approximately n times the wavelength λ, the sound pressure decreased.

Based on the above results, it is understood that in the electroacoustic transducers 1A to 1D in the above-described first to fourth preferred embodiments, high output is able to be easily achieved by appropriately setting the size of the gaps 42 in accordance with the dimensions of the respective portions.

Figure 10:
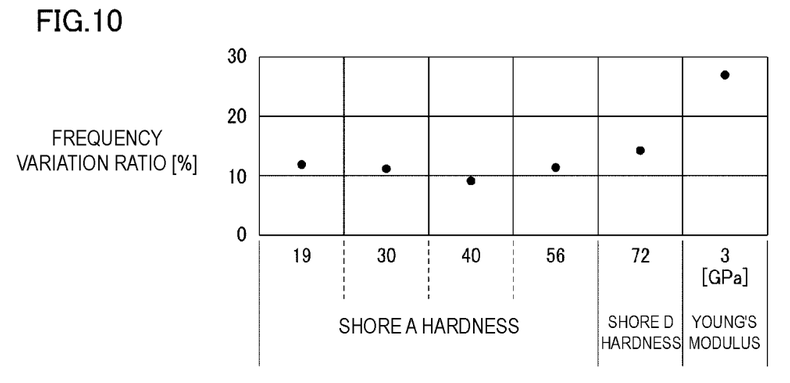
FIG. 10 is a graph indicating a result of a second verification test.

A second verification test was performed to examine, by actually manufacturing an electroacoustic transducer as a trial sample, changes in the stress relaxation effect when the hardness of the die bonding agent was changed. FIG. 10 is a graph indicating a result of the second verification test In the second verification test, a plurality of ultrasonic generators having the dimensions of the respective portions, which were the same or substantially the same as those of the models used in the first verification test, were manufactured. Here, for example, the height h of the gaps 42 between the ultrasonic element 20 and the ASIC 30 was set to about 0.03 mm, and the positions at which the gaps 42 were provided were set to the four locations of the central portions of the four sides of the ultrasonic element 20 in the same or substantially the same manner as in the first preferred embodiment (particularly, refer to FIG. 2). The width (corresponding to the distance between the adjacent fixing portions 40 in FIG. 2) of each of the gaps 42 at the four locations was approximately 0.3 mm and the cross-sectional area of the gaps 42 at the four locations was set to about 0.036 mm$^2$ in total, for example. Note that the height h of the gaps 42 was adjusted, for example, by setting the diameter of the glass frit included in the die bonding agent to about 0.03 [mm].

As the die bonding agent joining the ultrasonic element 20 and the ASIC 30, six types of die bonding agents having different hardness were prepared and the die bonding agent was changed for each trial sample to be manufactured. Here, for example, the hardnesses of the die bonding agents were Shore A hardness of about 19, Shore A hardness of about 30, Shore A hardness of about 40, Shore A hardness of about 56, Shore D hardness of about 72, and Young's modulus of about 3 GPa, and the hardness of these die bonding agents is increased in this order.

The stress relaxation effect was examined by actually driving the ultrasonic generators manufactured as trial samples, measuring frequencies of ultrasonic waves output therefrom when an ambient temperature was varied in a range of about –40[° C.] to about 80[° C.] at a predetermined temperature interval under the same or substantially the same driving conditions, and calculating frequency variation ratios[%] of the ultrasonic waves at other temperatures relative to the frequency of the ultrasonic waves at the ambient temperature of about 25° C. In other words, the stress relaxation effect is high when the frequency variation ratio is low and the stress relaxation effect is low when the frequency variation ratio is high.

As a result, as illustrated in FIG. 10, it was confirmed that the frequency variation ratio was reduced to be equal to or lower than about 15% when the die bonding agent having Shore D hardness of equal to or lower than about 72 was used. In addition, it was confirmed that the frequency variation ratio was equal to or lower than about 30% even when the die bonding agent having the Young's modulus of about 3 GPa was used as the die bonding agent that is harder than the die bonding agent having the Shore D hardness of about 72.

Based on the above-described results, it is understood that a higher stress relaxation effect is obtained by using a die bonding agent that is softer than the die bonding agent having the Shore D hardness of about 72 in each of the electroacoustic transducers 1A to 1D in the first to fourth preferred embodiments.

In the first to fourth preferred embodiments, the present invention is applied to ultrasonic generators as the electroacoustic transducers. Preferred embodiments of the present invention may be applied to ultrasonic sensors as well. In the first to fourth preferred embodiments, the present invention is applied to the electroacoustic transducer including the piezoelectric ultrasonic element. Preferred embodiments of the present invention is also applicable to an electroacoustic transducer including an electrostatic capacitance ultrasonic element.

In the first to fourth preferred embodiments, electroacoustic transducers in each of which the ultrasonic element and the ASIC are accommodated in the case body are described as an example. However, the drive circuit to drive the ultrasonic element, a processing circuit to process an output signal of the ultrasonic element, and other circuits need not necessarily be accommodated in the case body and only the ultrasonic element may be accommodated in the case body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An electroacoustic transducer comprising:
an ultrasonic element including a diaphragm that includes a first main surface and a second main surface located at opposing positions and a support frame defining a hole facing the diaphragm and supporting the diaphragm;
a case body including a top plate portion opposing the first main surface, a bottom plate portion opposing the second main surface, and a peripheral wall portion connecting the top plate portion and the bottom plate portion, the case body accommodating the ultrasonic element therein and including a sound hole is provided; and
a fixing portion fixing the ultrasonic element to the case body by joining the support frame and the bottom plate portion; wherein
the fixing portion is partially provided along a circumferential direction of the support frame such that a space between the second main surface and the bottom plate portion communicates with a space around the ultrasonic element;
an acoustic path connecting the first main surface and the second main surface and the sound hole and generating resonance in the case body is provided in the case body; and
the fixing portion is defined by a die bonding agent including a spherical spacer.
2. The electroacoustic transducer according to claim 1, wherein the diaphragm has a membrane structure including a piezoelectric thin film.
3. The electroacoustic transducer according to claim 1, wherein Shore D hardness of the die bonding agent is equal to or lower than about 72.
4. The electroacoustic transducer according to claim 1, wherein the sound hole is provided in at least one of the top plate portion and the bottom plate portion.
5. The electroacoustic transducer according to claim 1, wherein a projection projecting from a surface of the bottom plate portion toward the support frame partially along the circumferential direction of the support frame is provided on a portion of the surface of the bottom plate portion, which faces the support frame portion; and the projection and the support frame portion are joined together by the fixing portion.

6. The electroacoustic transducer according to claim 1, wherein the bottom plate portion is defined by a substrate; and the top plate portion and the peripheral wall portion are defined by a cover provided on the substrate.

7. The electroacoustic transducer according to claim 1, wherein the ultrasonic element is disposed on an integrated circuit element electrically connected to the ultrasonic element;

the integrated circuit element is mounted on a substrate;

the bottom plate portion is defined by the substrate and the integrated circuit element; and the top plate portion and the peripheral wall portion are defined by a cover provided on the substrate.

8. The electroacoustic transducer according to claim 1, wherein the sound hole is provided on the top plate portion and opposes the first main surface of the diaphragm.

9. The electroacoustic transducer according to claim 1, wherein the sound hole is provided on the bottom plate portion and opposes the second main surface of the diaphragm.

10. The electroacoustic transducer according to claim 1, further comprising an integrated circuit element fixed to the case body.

11. The electroacoustic transducer according to claim 10, wherein the integrated circuit element is an Application Specific Integrated Circuit.

12. The electroacoustic transducer according to claim 7, wherein the integrated circuit element is an Application Specific Integrated Circuit.

13. The electroacoustic transducer according to claim 6, wherein the cover is box shaped.

14. The electroacoustic transducer according to claim 7, wherein the cover is box shaped.

15. The electroacoustic transducer according to claim 1, wherein the diaphragm is a piezoelectric thin film.

16. The electroacoustic transducer according to claim 15, wherein the piezoelectric thin film is made of AlN or PZT.

17. The electroacoustic transducer according to claim 1, wherein the support frame is made of silicon.

18. The electroacoustic transducer according to claim 1, wherein the die bonding agent includes silicon resin or low elastic epoxy resin as an adhesive component.

19. The electroacoustic transducer according to claim 1, wherein the spherical spacer is glass frit.

20. The electroacoustic transducer according to claim 1, wherein a diameter of the spherical spacer is equal to or larger than about 30 μm.

* * * * *